United States Patent
Muraki et al.

(10) Patent No.: US 10,268,108 B2
(45) Date of Patent: Apr. 23, 2019

(54) FUNCTION ENHANCEMENT DEVICE, ATTACHING/DETACHING STRUCTURE FOR FUNCTION ENHANCEMENT DEVICE, AND FUNCTION ENHANCEMENT SYSTEM

(71) Applicant: JAI LTD., Kanagawa (JP)

(72) Inventors: Yosuke Muraki, Kanagawa (JP); Hiroaki Takahashi, Kanagawa (JP); Nagatake Asano, Kanagawa (JP); Masao Watabe, Kanagawa (JP)

(73) Assignee: JAI LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 15/563,231

(22) PCT Filed: Apr. 27, 2016

(86) PCT No.: PCT/JP2016/063140
§ 371 (c)(1),
(2) Date: Sep. 29, 2017

(87) PCT Pub. No.: WO2016/175225
PCT Pub. Date: Nov. 3, 2016

(65) Prior Publication Data
US 2018/0088446 A1 Mar. 29, 2018

(30) Foreign Application Priority Data
Apr. 28, 2015 (JP) .................................. 2015-091756

(51) Int. Cl.
*H04N 5/225* (2006.01)
*G03B 17/56* (2006.01)
(Continued)

(52) U.S. Cl.
CPC ........... *G03B 17/568* (2013.01); *H04N 5/225* (2013.01); *H04N 5/2251* (2013.01);
(Continued)

(58) Field of Classification Search
CPC .. G03B 17/568; H05K 5/0069; H05K 5/0204; H05K 5/02; H04N 5/2252; H04N 5/225; G06T 2207/10004
See application file for complete search history.

(56) References Cited

U.S. PATENT DOCUMENTS 8,199,251 B2 * 6/2012 Woodman .............. G03B 17/02
348/375
2013/0128110 A1 5/2013 Jannard

FOREIGN PATENT DOCUMENTS

| JP | 07-264450 A | 10/1995 |
|---|---|---|
| JP | 2012-514391 A | 6/2012 |
| JP | 2013-114457 A | 6/2013 |

OTHER PUBLICATIONS

International Search Report issued for corresponding PCT/JP2016/063140 application.

* cited by examiner

*Primary Examiner* — Padma Haliyur
(74) *Attorney, Agent, or Firm* — IP Business Solutions, LLC

(57) ABSTRACT

Provided is a technique capable of flexibly incorporating a function according to needs, taking into consideration a user's selection of a function to be enhanced.

According to the technique, provided is a function enhancement device 3 detachably interposed between an imaging device 1 configured to image a subject and acquire image data, and an interface device 2 configured to perform data communication with an external device so as to enhance a function of the imaging device 1. The function of the imaging device 1 to be enhanced is selectable from at least one of an image processing function of processing the image data, an operation environment retaining function of retaining an operation environment of the imaging device 1, a transmission method changing function of changing a transmission method of image data, and a subject recognition function of recognizing a subject from image data.

16 Claims, 12 Drawing Sheets

(51) Int. Cl.
*H05K 5/02* (2006.01)
*H05K 5/00* (2006.01)
*H04N 5/232* (2006.01)

(52) U.S. Cl.
CPC ......... *H04N 5/2252* (2013.01); *H04N 5/2257* (2013.01); *H04N 5/23209* (2013.01); *H05K 5/0069* (2013.01); *H05K 5/02* (2013.01); *H05K 5/0204* (2013.01); *G06T 2207/10004* (2013.01)

FUNCTION ENHANCEMENT DEVICE, ATTACHING/DETACHING STRUCTURE FOR FUNCTION ENHANCEMENT DEVICE, AND FUNCTION ENHANCEMENT SYSTEM

TECHNICAL FIELD

The present disclosure relates to a function enhancement device, an attaching/detaching structure for a function enhancement device, and a function enhancement system. More specifically, the present disclosure relates to a function enhancement device configured to enhance a function of an imaging device, an attaching/detaching structure for a function enhancement device, and a function enhancement system.

BACKGROUND ART

In a general video camera, there is widely used, as an imaging element, a solid-state imaging element such as a well-known CMOS (Complementary Metal Oxide Semiconductor) sensor or a well-known CCD (Charge Coupled Device) sensor.

Conventionally, a video camera of this type includes a camera housing configured to accommodate a CCD and having a camera mounting surface; a front panel mounted on a front end portion of the camera housing, and having a lens barrel mounting surface exposed in a screw hole opened in an optical axis direction (a front-rear direction) and an opening peripheral edge of the screw hole; and a lens barrel engaged within the screw hole of the front panel and having an opening end surface in abutment contact with the lens barrel mounting surface.

For instance, Patent Literature 1 discloses a video camera, in which a substrate on which a CCD as an imaging element is mounted, and a substrate on which a connector for external connection is mounted are provided within a camera housing, and an imaging unit (the imaging element) and an interface unit (the connector for external connection) are integrally mounted.

CITATION LIST

Patent Literature

[Patent Literature 1] JP-A No. H7-264450

SUMMARY OF THE INVENTION

In the technique disclosed in Patent Literature 1, in a case where various functions of a video camera are enhanced, it is necessary to select and use a function enhancement device of a different type for each function.

The present disclosure is proposed to solve the aforementioned inconveniences. An object of the present disclosure is to provide a function enhancement device capable of flexibly incorporating a function according to needs, taking into consideration a user's selection of a function to be enhanced, an attaching/detaching structure for a function enhancement device, and a function enhancement system.

As a result of intensive research to attain the aforementioned object, the inventor of the present application came up with an idea of interposing a function enhancement device between an imaging device and an interface device, and completed the present invention.

Specifically, the present disclosure provides a function enhancement device detachably interposed between an imaging device configured to image a subject and acquire image data, and an interface device configured to perform data communication with an external device so as to enhance a function of the imaging device.

Next, the present disclosure provides an attaching/detaching structure for a function enhancement device, wherein at least one of an imaging device configured to image a subject and acquire image data, and an interface device configured to perform data communication with an external device, and the function enhancement device interposed between the imaging device and the interface device so as to enhance a function of the imaging device are configured such that a connector plug is provided in one of the members, and a connector receptacle with respect to which the connector plug is insertable and withdrawable is provided in the other of the members, and the function enhancement device is detachably attachable to at least one of the imaging device and the interface device by insertion or withdrawal of the connector plug with respect to the connector receptacle.

Next, the present disclosure provides an attaching/detaching structure for the function enhancement device including a plurality of function enhancement devices, each of which is interposed between an imaging device configured to image a subject and acquire image data, and an interface device configured to perform data communication with an external device so as to enhance a function of the imaging device, wherein one of the plurality of function enhancement devices includes a connector plug or a connector receptacle capable of implementing insertion or withdrawal with respect to the other one of the function enhancement devices.

Next, the present disclosure provides the function enhancement system including an imaging device configured to image a subject and acquire image data;

an interface device configured to perform data communication with an external device; and a function enhancement device detachably interposed between the imaging device and the interface device so as to enhance a function of the imaging device.

According to the present disclosure, it is possible to provide a function enhancement device capable of flexibly incorporating a function according to needs, taking into consideration a user's selection of a function to be enhanced. Note that advantageous effects of the present disclosure described herein are not necessarily limited, and any advantageous effects described in the present disclosure are available.

DESCRIPTION OF EMBODIMENTS

Figure 1:
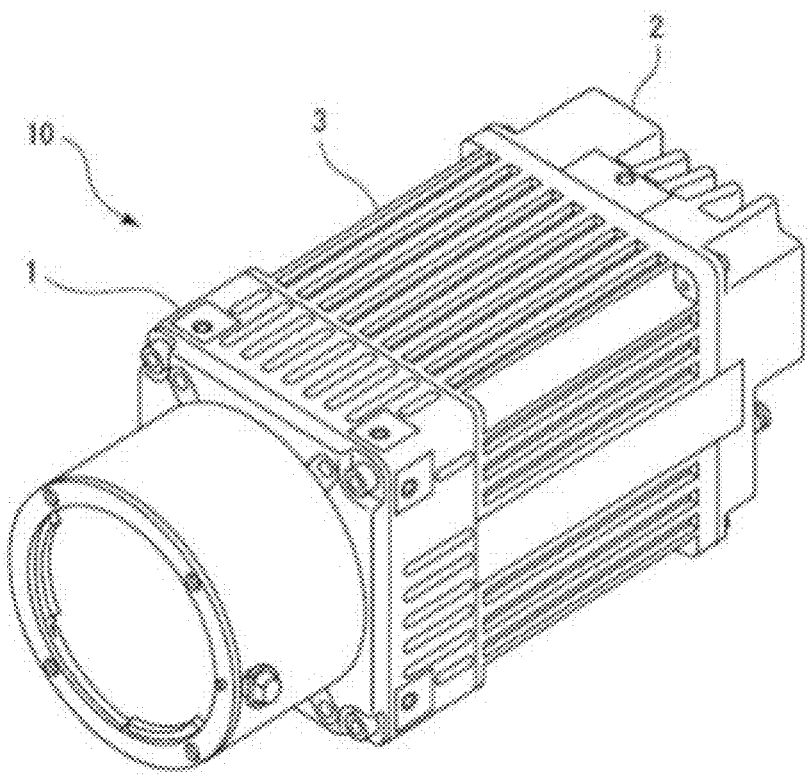
FIG. 1 is an external perspective view of a function enhancement system 10 according to an embodiment of the present disclosure.

In the following, a preferred embodiment for implementing the present disclosure is described referring to the drawings. The embodiment described in the following is an example of a representative embodiment of the present disclosure, and does not limit the scope of the present disclosure. Note that description is made in the following order.

A function enhancement device, an attaching/detaching structure for a function enhancement device, and a function enhancement system according to an embodiment of the present disclosure are described.

[Overall Configuration]

FIG. 1 is an external perspective view of a function enhancement system 10 according to an embodiment of the present disclosure. As will be described in the following, the function enhancement system 10 according to the present disclosure is constituted by an imaging device 1, an interface device 2, and function enhancement devices 3 of a predetermined number N (in the embodiment, it is assumed that the number is "1" to simplify the description), each of which is interposed between these devices, is detachably attachable to these devices, and has a prescribed function. In the following, each device is described in detail.

[Imaging Device 1]

Figure 2:
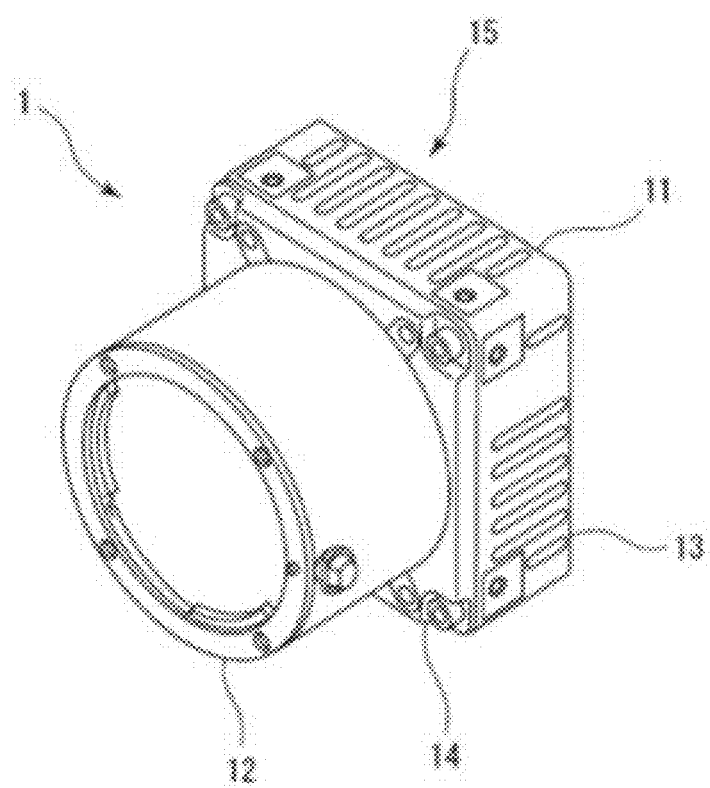
FIG. 2 is an external perspective view of an imaging device 1 on the front side.

FIG. 2 is an external perspective view of the imaging device 1 on the front side. The imaging device 1 is configured to image a subject and acquire image data. The imaging device 1 includes a lens, an imaging element, an A/D converter, and the like.

The imaging device 1 is constituted by a main body 11 having a substantially rectangular parallelepiped-shaped external appearance as a whole, and a lens barrel 12 detachably mounted to a front surface portion of the main body 11 and having a plurality of lenses. The main body 11 is constituted by a housing 13 having an upper wall plate, a lower wall plate, a left wall plate, and a right wall plate facing each other, and opened in a front-rear direction; a front plate 14 mounted on a front opening portion of the housing 13 and opened in an optical axis direction; and a rear plate 15 mounted on a rear opening portion of the housing 13 and having a through-opening for external connection opened in front and rear surfaces of the housing 13. A printed substrate to be connected to the imaging element and the like is accommodated in the housing 13.

The imaging element images a subject by a subject light flux passing through the lens. As an imaging element, a solid-state imaging element such as a well-known CMOS sensor or a well-known CCD sensor may be exemplified. The imaging element includes a plurality of photoelectric conversion elements configured to receive a subject light flux. The imaging element outputs analog signals respectively generated by the plurality of photoelectric conversion elements according to an accumulated charge amount to the A/D converter. The A/D converter converts the analog signals into digital signals, and outputs the digital signals to the function enhancement device 3 as image data.

Note that a temperature sensor disposed in the vicinity of an imaging element and capable of detecting a temperature of the imaging element, a well-known dehumidifier element for keeping the inside of the housing 13 to a preferred humidity, and a well-known heating heater for keeping an internal temperature of the housing 13 to a preferred temperature may be provided within the housing 13.

Note that the imaging device 1 may include an image processing circuit configured to perform a process of correcting PRNU (Photo Response Non-Uniformity) of pixels, a process of correcting DSNU (Dark Signal Non-Uniformity) of pixels, and a process of correcting black level of luminance, for instance.

The imaging device 1 has a mechanical structure that the imaging device 1 is directly engageable with an end of the function enhancement device 3. The mechanical structure of the imaging device 1 is not specifically limited, as far as advantageous effects of the present disclosure are not impaired. The imaging device 1 may have a mechanical structure that the imaging device 1 is directly engageable with an end of the interface device 2. The imaging device 1 includes a connector plug 4-A (see FIG. 7) for use in transmitting and receiving an electrical signal or an optical signal to and from the function enhancement device 3. The connector plug 4-A is mounted on the rear plate 15.

[Interface Device 2]

Figure 3:
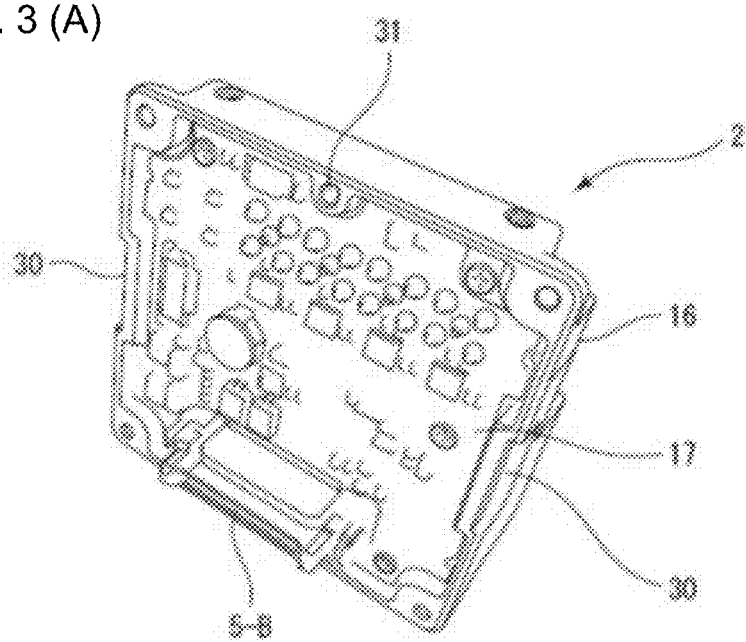
FIG. 3A is an external perspective view of an interface device 2 on the front side.
FIG. 3B is an external perspective view of the interface device 2 on the rear side.
Figure 3:
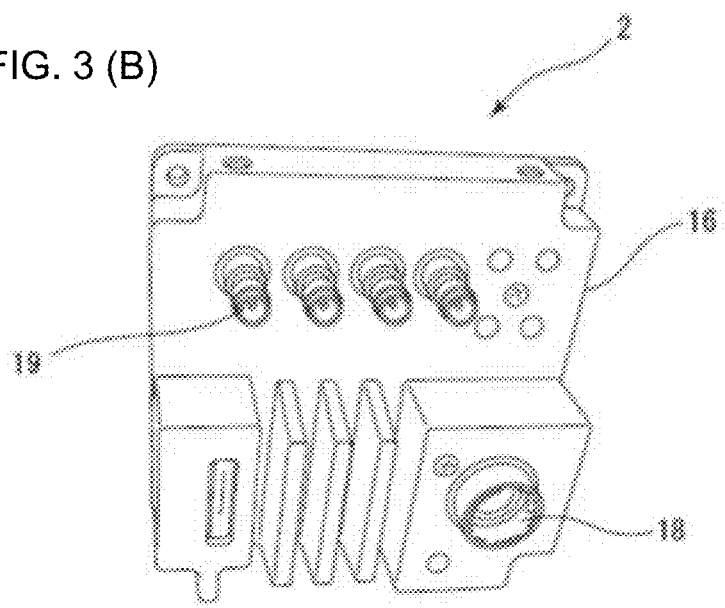

FIG. 3A is an external perspective view of the interface device 2 on the front side, and FIG. 3B is an external perspective view of the interface device 2 on the rear side. In the interface device 2, data communication is performed with respect to an external device such as a personal computer, for instance. For instance, the interface device 2 can perform communication by a method according to standards such as USB (Universal Serial Bus), GbE (Gigabit Ethernet), FIBER (TBD), or CXP (CoaXPress).

The interface device 2 is constituted by a main body 16 having a box-shaped external appearance and opened in a front direction, and a printed substrate 17 mounted on a front opening portion of the main body 16. As illustrated in FIG. 3B, a connector 18, a pin 19, and the like for use in transmitting and receiving an electrical signal or an optical signal to and from an unillustrated external device are disposed on the rear side of the main body 16. In the interface device 2 of the embodiment, four pins 19 according to CXP4 standard are disposed side by side.

The interface device 2 has a mechanical structure that the interface device 2 is directly engageable with the other end of the function enhancement device 3. The mechanical structure of the interface device 2 is not specifically limited, as far as advantageous effects of the present disclosure are not impaired. The interface device 2 may have a mechanical structure that the interface device 2 is directly engageable with an end of the imaging device 1.

[Function Enhancement Device 3]

Figure 4:
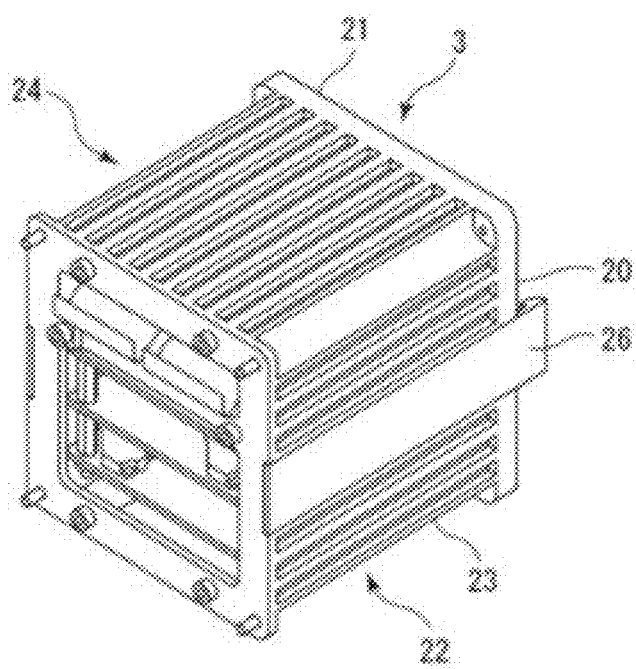
FIG. 4A is an external perspective view of a function enhancement device 3 on the front side.
FIG. 4B is an external perspective view of the function enhancement device 3 on the rear side.
Figure 4:
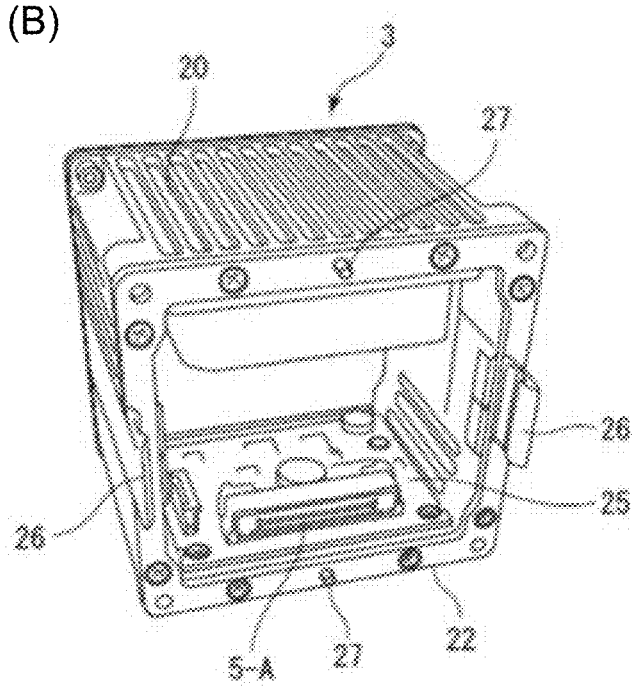

FIG. 4A is an external perspective view of the function enhancement device 3 on the front side, and FIG. 4B is an external perspective view of the function enhancement device 3 on the rear side. The function enhancement device 3 has a structure that the function enhancement device 3 is detachably interposed between the imaging device 1 and the interface device 2 to enhance a function of the imaging device 1. The term "enhancement" herein includes a case where a function intrinsic to the imaging device 1 is enhanced, and a case where a function intrinsic to the imaging device 1 is modified.

The function enhancement device 3 includes various microprocessors such as a CPU (Central Processing Unit), a GPU (Graphics Processing Unit), and a DSP (Digital Signal Processor), and various IC memories such as an ASIC (Application Specific Integrated Circuit), an RAM, and an ROM, for instance.

The function enhancement device 3 includes a housing 20 having a tubular external appearance as a whole. The housing 20 includes an upper wall plate 21, a lower wall plate 22, a left wall plate 23, and a right wall plate 24 facing each other, and includes a through-opening opened in a front-rear direction. A printed substrate 25 on which the various microprocessors and the various IC memories are mounted is disposed on the lower wall plate 22. Note that the function enhancement device 3 may include a well-known fan capable of cooling the imaging device 1 via the through-opening within the housing 20.

The function enhancement device 3 has a mechanical structure that the function enhancement device 3 is directly engageable with an end of the imaging device 1 and an end of the interface device 2. The function enhancement device 3 includes a connector receptacle 4-B (see FIG. 7) for use in transmitting and receiving an electrical signal or an optical signal to and from the imaging device 1. The connector receptacle 4-B is disposed on the lower wall plate 22, for instance. The connector plug 4-A provided in the imaging device 1 is insertable and withdrawable with respect to the connector receptacle 4-B.

[Attaching/Detaching Structure for Function Enhancement Device 3]

Figure 5:
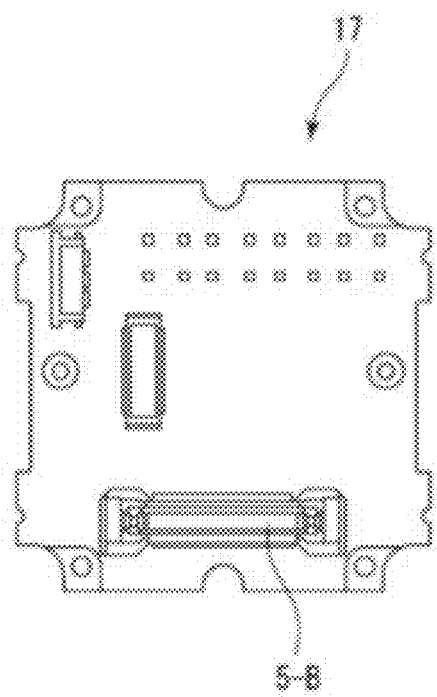
FIG. 5A is a front view of a printed substrate 17 on which a connector plug 5-B is mounted.
FIG. 5B is a side view of the printed substrate 17.
Figure 5:
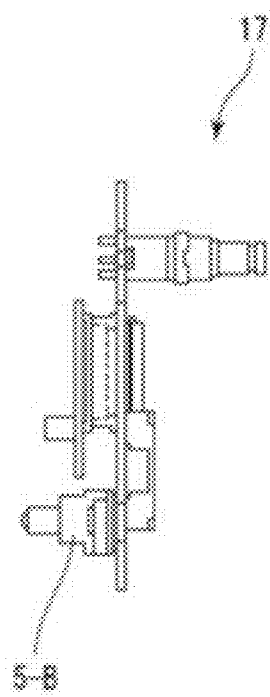
Figure 6:
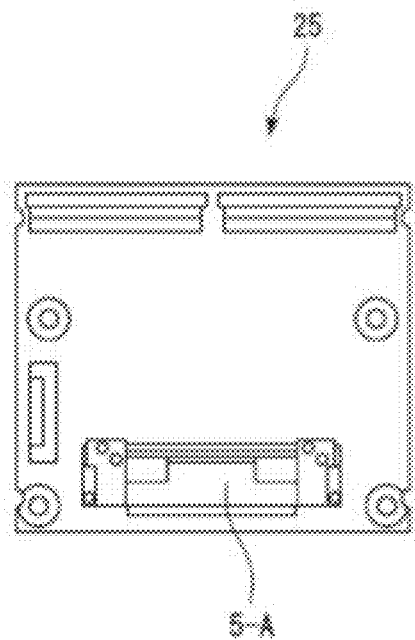
FIG. 6A is a front view of a printed substrate 25 on which a connector receptacle 5-A with respect to which the connector plug 5-B is insertable and withdrawable is mounted.
FIG. 6B is a side view of the printed substrate 25.
Figure 6:
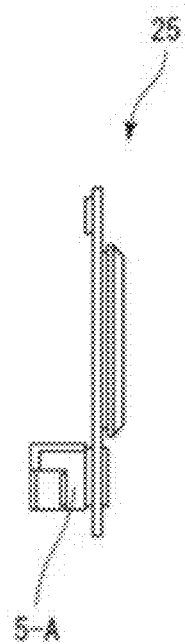

FIG. 5A is a front view of the printed substrate 17 on which a connector plug 5-B is mounted. FIG. 5B is a side view of the printed substrate 17. FIG. 6A is a front view of the printed substrate 25 on which the connector receptacle 5-A with respect to which the connector plug 5-B is insertable and withdrawable is mounted. FIG. 6B is a side view of the printed substrate 25.

In the embodiment, the connector plug 5-B for use in transmitting and receiving an electrical signal or an optical signal to and from the function enhancement device 3 is provided in the interface device 2. As illustrated in FIG. 5A and FIG. 5B, the connector plug 5-B is mounted on the printed substrate 17. On the other hand, the connector receptacle 5-A for use in transmitting and receiving an electrical signal or an optical signal to and from the interface device 2 is provided in the function enhancement device 3. As illustrated in FIG. 6A and FIG. 6B, the connector receptacle 5-A is mounted on the printed substrate 25. In the embodiment, the function enhancement device 3 is detachably attachable to the interface device 2 by insertion or withdrawal of the connector plug 5-B with respect to the connector receptacle 5-A. Likewise, in the embodiment, the function enhancement device 3 is detachably attachable to the imaging device 1 by insertion or withdrawal of the connector plug 4-A with respect to the connector receptacle 4-B.

Further, in the function enhancement device 3, a pair of hooks 26 are formed at positions facing each other on a rear surface portion of the housing 20 (see FIG. 4B). Note that the hooks 26 are disposed at positions where a user can hold the function enhancement device 3 with his/her thumb and index finger. Therefore, the function enhancement device 3 is easy to use, and provides stable and user-friendly operability.

A pair of hook receiving portions 30 engageable with the hooks 26 are formed in the main body 16 of the interface device 2 (see FIG. 3A). In the embodiment, the function enhancement device 3 is fixedly mounted to the interface device 2 by engagement between the hooks 26 and the hook receiving portions 30 in a state that the connector plug 5-B is inserted in the connector receptacle 5-A. Further, the hooks 26 and the hook receiving portions 30 are provided so that a user can audibly or visually check whether or not mounting of the function enhancement device 3 to the interface device 2 is securely completed.

Further, in the function enhancement device 3, a pair of guide pins 27 are formed at positions facing each other on a rear surface portion of the housing 20, and extend in a direction in which the connector plug 5-B is inserted or withdrawn (see FIG. 4B). Guide grooves 31 engageable with the guide pins 27 are formed in the main body 16 of the interface device 2 (see FIG. 3A). Preferably, the guide grooves 31 may have a long-hole shape in order to absorb size variation. Preferably, the long hole may have a long size in an up-down direction than in a left-right direction in order to prevent displacement in the left-right direction.

In the embodiment, the function enhancement device 3 is guided to the interface device 2 by engagement of the guide pins 27 in the guide grooves 31 in inserting the connector plug 5-B in the connector receptacle 5-A.

[Transmission Path of Signal between Devices]

Figure 7:
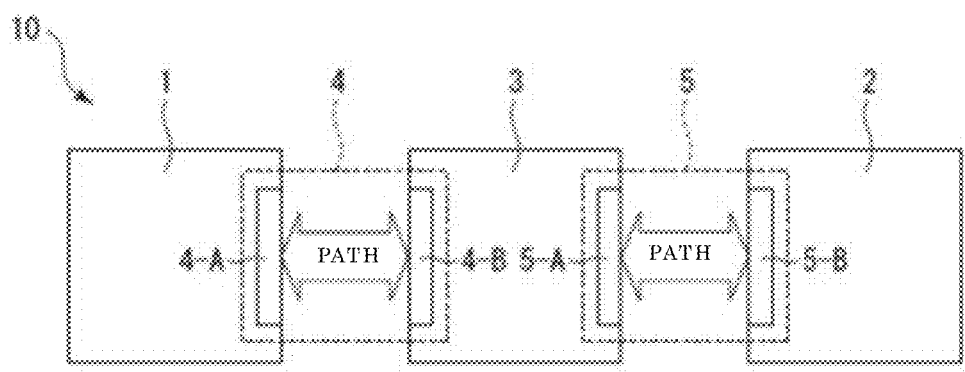
FIG. 7 is an explanatory diagram illustrating an example of a transmission path of a signal between the devices according to the embodiment of the present disclosure.

FIG. 7 is an explanatory diagram illustrating an example of a transmission path of a signal between the devices according to the embodiment of the present disclosure. As illustrated in FIG. 7, connectors 4 and 5 are interposed in buses for use in transmitting a signal between the imaging device 1, the interface device 2, and the function enhancement device 3. Note that preferably, the connectors 4 and 5 may be of a floating type capable of absorbing error in manufacturing the parts.

The connector 4 is interposed between the imaging device 1 and the function enhancement device 3. The connector 4 is constituted by the connector plug 4-A and the connector receptacle 4-B. On the other hand, the connector 5 is interposed between the function enhancement device 3 and the interface device 2. The connector 5 is constituted by the connector receptacle 5-A and the connector plug 5-B.

[Format and Content of Packet to be Transmitted between Devices]

Figure 8:
FIG. 8 is an explanatory diagram illustrating an example of a format and a content of a packet to be transmitted between the devices according to the embodiment of the present disclosure.

FIG. 8 is an explanatory diagram illustrating an example of a format and a content of a packet to be transmitted between the devices 1 to 3 according to the embodiment of the present disclosure. A packet illustrated in FIG. 8 is constituted by four fields i.e. an identification field #1, an address field #2, a control field #3, and a data field #4.

The identification field #1 stores types of data to be stored in the data field #4. Further, identification information of a device to which data located in the data field #4 is to be transmitted is located in the address field #2. Further, the format of a process to be applied to data located in the data field #4 is located in the control field #3. Lastly, data to be processed is stored in the data field #4. Note that in the following, data located in the data field #4 and to be transmitted between the devices may be generically referred to as "transmission data".

[Functions of Imaging Device 1 to be Enhanced]

In the present disclosure, it is possible to select, as a function of the imaging device 1 to be enhanced by the function enhancement device 3, at least one from an image processing function (1), an operation environment retaining function (2), a transmission method changing function (3), and a subject recognition function (4).

(1) Image Processing Function

The image processing function means a function of processing image data, and includes the following functions (1-1) to (1-7).

(1-1) Image Correcting Function

The imaging device 1 transmits image data obtained by imaging a subject to the function enhancement device 3 via the connector 4. Note that image data is located in the data field #4 illustrated in FIG. 8. Identification information "3" of the function enhancement device 3 to which image data is transmitted is located in the address field #2 illustrated in FIG. 8. The function enhancement device 3 applies an image correcting process such as defect pixel correction with respect to image data extracted via the connector 4. Correction information necessary for a correction process is stored in the control field #3 illustrated in FIG. 8.

(1-2) Resolution Changing Function

When this function is implemented, the function enhancement device 3 applies a resolution changing process to transmission data. When this function is implemented, information necessary for changing a resolution such as a target resolution, for instance, is stored in the control field #3 illustrated in FIG. 8, and the image resolution is changed from 2 k to 4 k, for instance. The function (1-2) is substantially the same as the function (1-1) except for the above.

(1-3) Digital Zoom Function

When this function is implemented, the function enhancement device 3 applies a digital zoom process to transmission data. Specifically, the function enhancement device 3 interpolates pixels by a well-known interpolation method or the like in expanding an image, or thins out pixels in contracting an image. When this function is implemented, information necessary for a digital zoom process such as zoom magnification, for instance, is stored in the control field #3 illustrated in FIG. 8. The function (1-3) is substantially the same as the function (1-1) except for the above.

(1-4) Image Compressing Function

When this function is implemented, the function enhancement device 3 applies an image compressing process to transmission data. When this function is implemented, information necessary for a compressing process such as a target compression ratio, for instance, is stored in the control field #3 illustrated in FIG. 8, and a compressing process of a predetermined compression format (e.g. JPEG, MPEG, H.264) is applied to image data. The function (1-4) is substantially the same as the function (1-1) except for the above.

(1-5) Gradation Correcting Function

When this function is implemented, the function enhancement device 3 applies a gradation correcting process to transmission data. When this function is implemented, information necessary for a gradation correcting process such as a target gradation value, for instance, is stored in the control field #3 illustrated in FIG. 8. The function (1-5) is substantially the same as the function (1-1) except for the above.

(1-6) Low-pass Filter Function

When this function is implemented, the function enhancement device 3 applies a filtering process to transmission data by a low-pass filter. When this function is implemented, information necessary for a filtering process such as a cut-off frequency, for instance, is stored in the control field #3 illustrated in FIG. 8, and a low frequency component is isolated from image data. The function (1-6) is substantially the same as the function (1-1) except for the above.

(1-7) Spectral Processing Function

When this function is implemented, the function enhancement device 3 performs a spectral process by performing a component analysis or the like of observation light to be imaged based on transmission data. When this function is implemented, information necessary for the component analysis is stored in the control field #3 illustrated in FIG. 8. The function (1-7) is substantially the same as the function (1-1) except for the above.

(2) Operation Environment Retaining Function

The operation environment retaining function means a function of retaining an operation environment of an imaging device, and includes the following functions (2-1) to (2-3).

(2-1) Cooling Function by Fan

The imaging device 1 transmits a signal detected by a temperature sensor to the function enhancement device 3 via the connector 4 as temperature data of an imaging element. Note that temperature data is located in the data field #4 illustrated in FIG. 8. Identification information "3" of the function enhancement device 3 to which temperature data is transmitted is located in the address field #2 illustrated in FIG. 8. The function enhancement device 3 drives a fan in such a manner that an imaging element of the imaging device 1 can be cooled based on temperature data extracted via the connector 4. When this function is implemented, there is no specific process to be applied to the temperature data. Therefore, a null code "NUL" is located in the control field #3. Note that releasing heat or absorbing heat by a fan may be implemented by temperature control with use of a Peltier element provided in the imaging device 1, in place of using the fan.

(2-2) Heating Function by Heater

When this function is implemented, the function enhancement device 3 controls and drives a heating heater based on transmission data. When this function is implemented, an imaging element of the imaging device 1 is heated by receiving heat from a heating heater. The function (2-2) is substantially the same as the function (2-1) except for the above.

(2-3) Dehumidifying Function by Dehumidifier Element

When this function is implemented, the function enhancement device 3 controls and drives a dehumidifier element based on transmission data. Thus, an imaging element of the imaging device 1 is dehumidified. The function (2-3) is substantially the same as the function (2-1) except for the above.

(3) Transmission Method Changing Function

The transmission method changing function means a function of changing a transmission method of image data, and includes the following functions (3-1) and (3-2).

(3-1) Frame Buffer Function

The imaging device 1 transmits transmission data to the function enhancement device 3. The function enhancement device 3 stores transmission data in a buffer memory. Further, the function enhancement device 3 transmits transmission data stored in the buffer memory to the interface device 2 via the connector 5 by a well-known interlacing method. Note that identification information "2" of the interface device 2 to which transmission data is transmitted is located in the address field #2 illustrated in FIG. 8. The content of a transmission method (an interlacing method) is stored in the control field #3 illustrated in FIG. 8.

(3-2) Streaming Function

When this function is implemented, the imaging device 1 transmits transmission data to the interface device 2 by a well-known streaming method. When this function is implemented, the content of a transmission method (a streaming method) is stored in the control field #3 illustrated in FIG. 8. The function (3-2) is substantially the same as the function (3-1) except for the above.

(4) Subject Recognition Function

The subject recognition function means a function of recognizing a subject from image data, and includes the following functions (4-1) to (4-4).

(4-1) ITS (Intelligent Transport System)

When this function is implemented, the imaging device 1 installed on a highway transmits image data obtained by imaging a subject to the function enhancement device 3 via the connector 4. The function enhancement device 3 extracts and registers feature data of a subject based on extracted image data via the connector 4. Thereafter, the function enhancement device 3 traces the subject by collating the feature data within the image data imaged by the imaging device 1 with registered feature data. Note that feature data extracted from a subject is stored in the control field #3 illustrated in FIG. 8. The function (4-1) is substantially the same as the function (1-1) except for the above.

(4-2) Suveillance (Human Tracking)

When this function is implemented, image data obtained by imaging a target person is transmitted to the function enhancement device 3 via the connector 4. The function enhancement device 3 tracks and images a target person while synchronously moving positions/postures of all the imaging devices by detecting parameters (change values of a position/posture or the like) of the imaging device 1 at a point of time when image data is obtained, and by transmitting these parameters to the other imaging devices. When this function is implemented, parameters of the imaging device 1 are stored in the control field #3 illustrated in FIG. 8. The function (4-2) is substantially the same as the function (1-1) except for the above.

(4-3) Automatic Recognition Function of Number Plate, etc.

When this function is implemented, a software capable of recognizing a vehicle even in a bad weather condition such as a rainy weather, or a software capable of recognizing a number plate or a driver of the vehicle is installed in the function enhancement device 3. The imaging device 1 transmits image data obtained by imaging a vehicle to the function enhancement device 3 via the connector 4. The function enhancement device 3 recognizes the number plate, the driver, or the like of the vehicle based on the image data extracted via the connector 4. When this function is implemented, recognition information for use in recognizing a number plate, a driver, or the like is stored in the control field #3 illustrated in FIG. 8. The function (4-3) is substantially the same as the function (1-1) except for the above.

(4-4) Function of Transmitting Moving Image and Still Image

When this function is implemented, a software capable of storing a moving image and a still image of a vehicle or the like in response to a trigger from the outside, such as a sensor installed on a road, for instance, and transmitting the stored moving image and still image to a server according to a determination condition such as speeding is installed in the function enhancement device 3. The imaging device 1 transmits image data obtained by imaging a vehicle or the like to the function enhancement device 3 via the connector 4. The function enhancement device 3 stores the image data extracted via the connector 4 as a moving image or a still image. Further, the function enhancement device 3 transmits the stored moving image or still image to the interface device 2 via the connector 5 according to the determination condition. The transmitted moving image or still image is transmitted to a server via the interface device 2. Note that identification information "2" of the interface device 2 to which a moving image or a still image is transmitted is located in the address field #2 illustrated in FIG. 8. The determination condition is located in the control field #3 illustrated in FIG. 8. A moving image and a still image are stored in the data field #4 illustrated in FIG. 8.

In the embodiment, it is possible to provide the function enhancement system 10 capable of flexibly incorporating a function according to needs, taking into consideration a user's selection of a function to be enhanced. Further, in the function enhancement system 10 of the embodiment, it is possible to release and update an area programmable by a user himself/herself.

Further, in the embodiment, the function enhancement device 3 is detachably attachable to the interface device 2 by insertion or withdrawal of the connector plug 5-B with respect to the connector receptacle 5-A. Likewise, the function enhancement device 3 is detachably attachable to the imaging device 1 by insertion or withdrawal of the connector plug 4-A with respect to the connector receptacle 4-B. Therefore, it is not necessary to secure an extra length of a flexible cable, unlike a conventional configuration, in which connectors are connected to each other by a flexible cable.

Further, in the embodiment, a connector receptacle and a connector plug are directly connected. Therefore, it is possible to eliminate an inconvenience that an operator finds it difficult to insert his/her fingers in an operation of connecting between the devices, even if the mechanical size of the imaging device 1, the interface device 2, or the like is small, and to avoid that the operability in connecting these devices is impaired.

Further, in the embodiment, the function enhancement device 3 is fixedly mounted to the interface device 2 by engagement between the hooks 26 and the hook receiving portions 30 in a state that the connector plug 5-B is inserted in the connector receptacle 5-A. Therefore, it is possible to securely engage the function enhancement device 3 with the interface device 2 after engagement between the hooks and the hook receiving portions.

Further, in the embodiment, the function enhancement device 3 is guided to the interface device 2 by engagement of the guide pins 27 in the guide grooves 31 in inserting the connector plug 5-B in the connector receptacle 5-A. Therefore, it is possible to smoothly guide the connector receptacle and the connector plug to a position where the connector receptacle and the connector plug face each other and are engageable. Further, in the embodiment, the connector 5 itself constituted by the connector receptacle 5-A and the connector plug 5-B also plays a role of guiding the function enhancement device 3 to the interface device 2.

Further, the present disclosure may also have the following configuration.

(1)

A function enhancement device detachably interposed between an imaging device configured to image a subject and acquire image data, and an interface device configured to perform data communication with an external device so as to enhance a function of the imaging device.

(2)

The function enhancement device according to (1), wherein the function of the imaging device to be enhanced is selected from at least one of an image processing function of processing the image data, an operation environment retaining function of retaining an operation environment of the imaging device, a transmission method changing function of changing a transmission method of the image data, and a subject recognition function of recognizing the subject from the image data.

(3)

An attaching/detaching structure for a function enhancement device, wherein at least one of an imaging device configured to image a subject and acquire image data, and an interface device configured to perform data communication with an external device, and the function enhancement device interposed between the imaging device and the interface device so as to enhance a function of the imaging device are configured such that a connector plug is provided in one of the members, and a connector receptacle with respect to which the connector plug is insertable and withdrawable is provided in the other of the members, and the function enhancement device is detachably attachable to at least one of the imaging device and the interface device by insertion or withdrawal of the connector plug with respect to the connector receptacle.

(4)

The attaching/detaching structure for the function enhancement device according to (3), wherein at least one of the imaging device and the interface device, and the function enhancement device are configured such that a hook is provided in one of the members, and a hook receiving portion engageable with the hook is provided in the other of the members, and the function enhancement device is fixedly mounted to at least one of the imaging device and the interface device by engagement between the hook and the hook receiving portion in a state that the connector plug is inserted in the connector receptacle.

(5)

The attaching/detaching structure for a function enhancement device according to (3) or (4), wherein at least one of the imaging device and the interface device, and the function enhancement device are configured such that a guide pin extending in a direction in which the connector plug is inserted or withdrawn is provided in one of the members, and a guide groove engageable with the guide pin is provided in the other of the members, and the function enhancement device is guided to at least one of the imaging device and the interface device by engagement between the guide pin and the guide groove in inserting the connector plug in the connector receptacle.

(6)

An attaching/detaching structure for a function enhancement device including:

a plurality of function enhancement devices, each of which is interposed between an imaging device configured to image a subject and acquire image data, and an interface device configured to perform data communication with an external device so as to enhance a function of the imaging device, wherein one of the plurality of function enhancement devices includes a connector plug or a connector receptacle capable of implementing insertion or withdrawal with respect to the other one of the function enhancement devices.

(7)

The attaching/detaching structure for the function enhancement device according to (6), wherein one and the other one of the plurality of function enhancement devices respectively include a hook and a hook receiving portion mutually engageable in a state that the connector plug and the connector receptacle are engaged.

(8)

The attaching/detaching structure for the function enhancement device according to (6) or (7), wherein one and the other one of the plurality of function enhancement devices respectively include a guide pin and a guide groove mutually engageable in a state that the connector plug and the connector receptacle are engaged.

(9)

A function enhancement system including:

an imaging device configured to image a subject and acquire image data;

an interface device configured to perform data communication with an external device; and a function enhancement device detachably interposed between the imaging device and the interface device so as to enhance a function of the imaging device.

Figure 9:
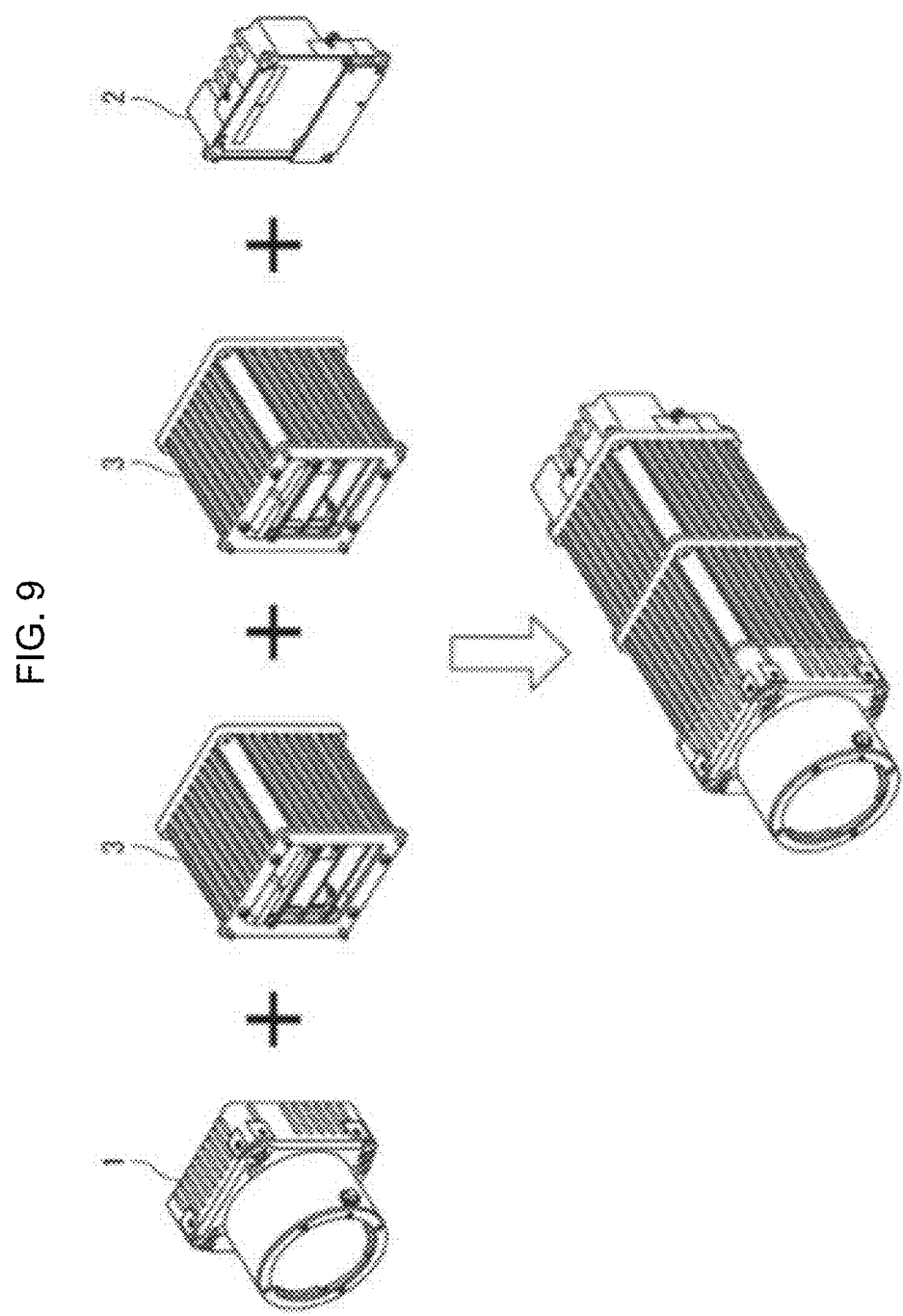
FIG. 9 is an external perspective view of a function enhancement system according to a modification of the present disclosure.

Note that in the function enhancement system of the embodiment, the function enhancement device 3 is detachably interposed between the imaging device 1 and the interface device 2. Alternatively, two or more function enhancement devices 3 may be detachably interposed between the imaging device 1 and the interface device 2. For instance, FIG. 9 illustrates a function enhancement system, in which two function enhancement devices 3 are interposed between an imaging device 1 and an interface device 2.

Note that in the function enhancement system of the embodiment, there is described an example, in which the imaging device 1 and the function enhancement device 3 are electrically connected with use of the connector 4, and the function enhancement device 3 and the interface device 2 are electrically connected with use of the connector 5. Alternatively, an imaging device 1 and a function enhancement device 3, and/or a function enhancement device 3 and an interface device 2 may be electrically connected by a flexible cable.

Figure 10:
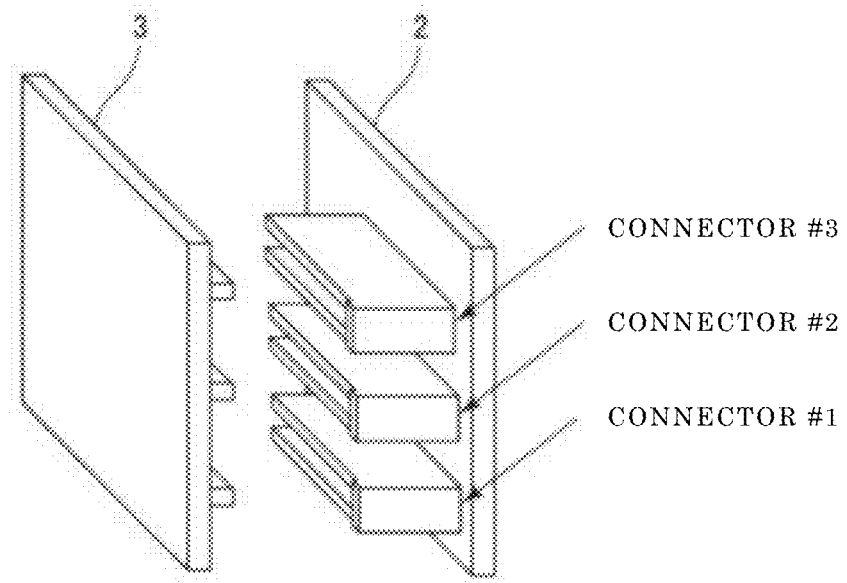
FIG. 10A is an external perspective view of a function enhancement system according to another modification of the present disclosure.
FIG. 10B is a front view of an interface device according to the another modification of the present disclosure.
Figure 10:
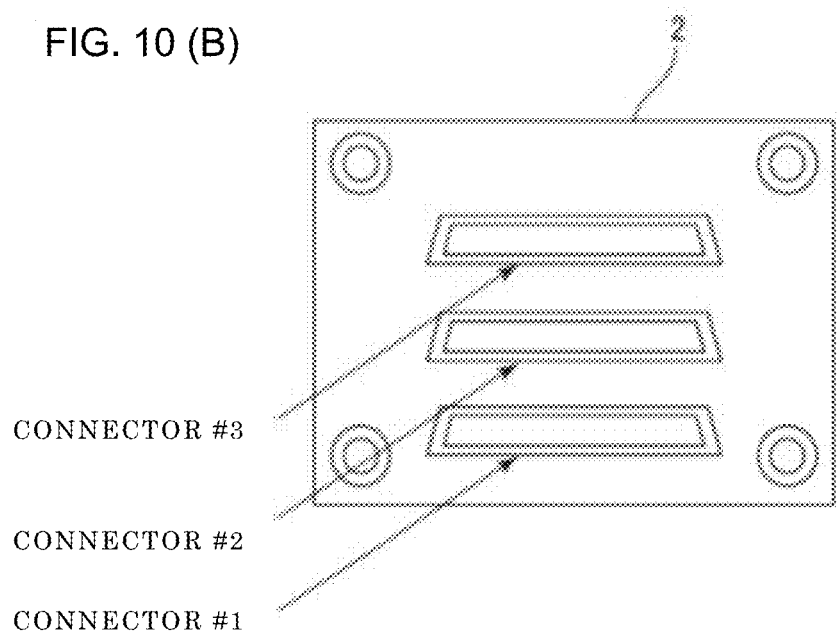

Note that in the function enhancement system of the embodiment, in a case where a frequency bandwidth of an image signal is not sufficient, as illustrated in FIG. 10A and FIG. 10B, the number of connectors (in this example, the number is "3") may be increased, and a transmission capacity may be distributed between connectors #1 to #3. For instance, a transmission capacity of 20 Gbps may be distributed to each of connectors #1 to #3. According to this configuration, it is possible to secure a transmission capacity of 60 Gbps with respect to the entirety of the connectors #1 to #3.

Figure 11:
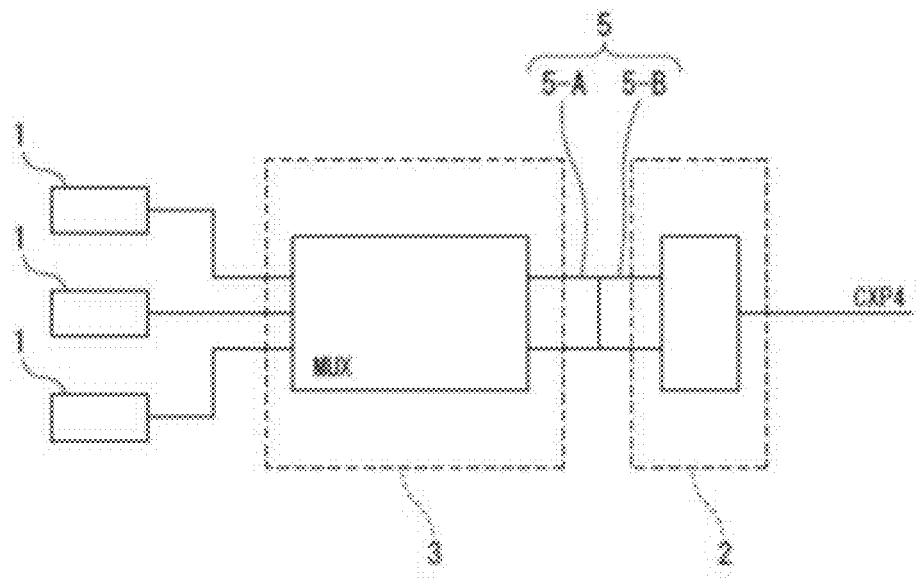
FIG. 11 is an external perspective view of the function enhancement system according to the another modification of the present disclosure.

Note that in the function enhancement system of the embodiment, outputs of a plurality of imaging devices 1, each of which has a small pixel number, may be combined by a function enhancement device 3 disposed at a post stage, and the combined output may be transmitted to an interface device 2, as illustrated in FIG. 11, for instance.

Figure 12:
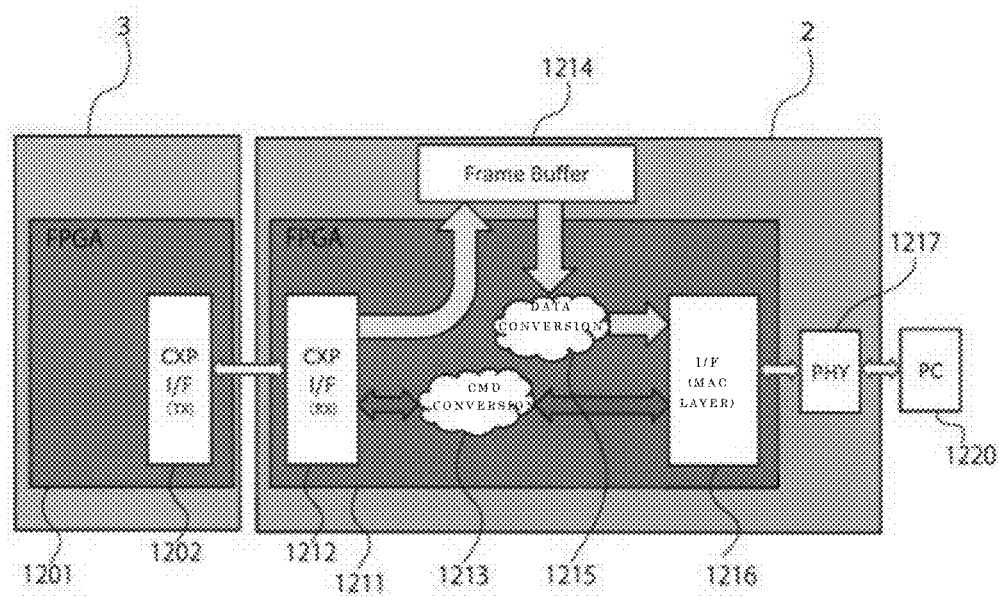
FIG. 12 is a block diagram illustrating protocol conversion according to the embodiment of the present disclosure.

FIG. 12 is a block diagram illustrating protocol conversion according to the embodiment of the present disclosure. Protocol conversion in an interface unit (an I/F unit) 2 is described using FIG. 12.

As illustrated in FIG. 12, the function enhancement device 3 mounted to the interface unit 2 includes a FPGA (Field-Programmable Gate Array) 1201 as an integrated circuit capable of programming, and an I/F 1202 of CXP standard, as a transmitter (TX) configured to transmit data and a command to the interface unit 2.

The interface unit 2 includes a FPGA 1211, and an I/F 1212 of CXP standard, as a receiver (RX) configured to receive data and a command from the function enhancement device 3. Further, the interface unit 2 includes a command (CMD) conversion unit 1213 configured to convert a command received from the function enhancement device 3, a frame buffer 1214 configured to temporarily store data, and a data conversion unit 1215 configured to packetize data received from the function enhancement device 3 via the frame buffer 1214. Further, as an example, the interface unit 2 includes an I/F 1216 of a media access control layer (an MAC layer) within a data link layer in an OSI reference model, and a physical layer (PHY) 1217.

In the embodiment, the I/F 1202 of the function enhancement device 3 transmits data to the interface unit 2. The I/F 1212 of the interface unit 2 receives data from the function enhancement device 3, transmits a command to the CDM conversion unit 1213, and transmits data to the data conversion unit 1215 via the frame buffer 1214.

The CDM conversion unit 1213 executes mutual conversion of a command between CXP, and GigE (GE), USB, or a Camera Link (CL) by conversion of an XML file. The data conversion unit 1215 packetizes data from CXP to GE, USB, CL, or the like. The conversion command and packetized data are input to the I/F 1216 of an MAC layer. The I/F 1216 of the MAC layer transmits the input conversion command and packetized data to the PHY 1217. The PHY 1217 transmits the received conversion command and packetized data to a PC 1220.

As described above, by performing protocol conversion with use of the function enhancement device 3 according to the embodiment, it is possible to integrate a communication method to CXP standard within the function enhancement system 10 of a camera or the like, even in a case where a protocol to be used differs depending on the type (USB, GbE, or the like) of an I/F on the user side. This makes it possible to reduce the development cost. Further, by using the function enhancement device 3, it is possible to directly connect I/Fs of various types other than an I/F of CXP standard to the function enhancement system 10. This also makes it possible to enhance the convenience of a user. Further, in the embodiment, there is described an example, in which a communication method is integrated to CXP standard. The present technique, however, is not limited to the above. By performing protocol conversion with use of the function enhancement device according to the present technique, it is also possible to integrate a communication method to a standard other than CXP standard, such as GE, USB, or CL.

Note that in the function enhancement system of the embodiment, there is described an example, in which the functions (1-1) to (1-7) are included in the image processing function (1). Alternatively, the following functions (1-8) to (1-12) may be included, in addition to the aforementioned functions.

(1-8) Mirroring Function

When this function is implemented, for instance, two or more function enhancement devices 3 may be interposed between the imaging device 1 and the interface device 2, image information obtained by imaging by the imaging device 1 may be stored in each of the function enhancement devices 3, individual image processing may be performed by the function enhancement devices 3, and in a case where a certain failure occurs in one of the function enhancement devices 3, image information stored in the other one of the function enhancement devices 3 may be used.

(1-9) Timestamp Function

When this function is implemented, for instance, timestamp information indicating a time when recording/updating/generation of image information recorded in the function enhancement device 3 is performed is managed. For instance, in a case where continuous photographing of continuously photographing a plurality of still images (frame images) is performed by the imaging device 1, it is possible to manage whether or not each frame image is photographed at a predetermined photographing time interval, based on the timestamp information.

(1-10) Pattern Matching Function

When this function is implemented, for instance, in a case where continuous photographing of continuously photographing a plurality of still images (frame images) is performed by the imaging device 1, it is possible to compare a template image as a reference and a subject image by a well-known cross-correlation method, and to extract only a moving subject (e.g. a traveling vehicle or the face of a driver in a vehicle) from still images (frame images), based on a degree of similarity between the images.

(1-11) Hyper Spectral Processing Function

When this function is implemented, for instance, it is possible to replace hyper spectral information acquired by area scanning with spectral information of a specific frequency band, based on a theoretical calculation.

(1-12) Polarization Processing Function

When this function is implemented, for instance, the function enhancement device 3 is capable of processing a polarization image.

Note that in the function enhancement device of the embodiment, it is possible to load the following application functions (A) to (R) in the function enhancement device 3. It is possible to enhance the performance of the imaging device 1 by loading the functions.

(A) Edge (Outline) Enhancement Function

When this function is implemented, for instance, the function enhancement device 3 is capable of enhancing an edge (outline) component in image information by multiplying an edge enhancement coefficient with an edge signal extracted from image information obtained by imaging by the imaging device 1, and by adding the multiplication result to original image information.

(B) Median Filter (Salt-and-Pepper Noise Removal) Function

When this function is implemented, for instance, the function enhancement device 3 performs a process of applying image processing to image information obtained by imaging by the imaging device 1 with use of a median filter, arranging density values in a local area of n×n in an ascending order, and setting a middle density value as an output density of a pixel in the center of the area. This makes it possible to remove salt-and-pepper noise.

(C) Color Matrix Function

When this function is implemented, for instance, the function enhancement device 3 applies a color matrix process to pixels of image information obtained by imaging by the imaging device 1 with use of a color matrix according to brightness of the pixels.

(D) Iris (Lens Aperture) Control Function

When this function is implemented, for instance, the function enhancement device 3 transmits an iris control signal for designating a position of a diaphragm (an aperture opening degree) to the imaging device 1. Further, in the imaging device 1, a position of the diaphragm is set to an aperture opening degree designated by the iris control signal.

(E) Water Mark (Electronic Watermark) Function

When this function is implemented, for instance, it is possible to discover an illegal copy on a network within image information obtained by imaging by the imaging device 1. Therefore, it is possible to embed information such as characters or numbers for specifying an author or the like.

(F) Masking Function

When this function is implemented, for instance, the function enhancement device 3 is able to perform a process of masking a specific portion (e.g. a face image of a person whose confidentiality is high) by lowering a resolution of the specific portion or by performing mosaic processing with respect to the specific portion out of image information obtained by imaging by the imaging device 1.

(G) HDR (High Dynamic Range) Function

When this function is implemented, for instance, the function enhancement device 3 is able to perform a process of generating an image whose dynamic range is increased by combining a plurality of pieces of image information whose exposure amounts obtained by imaging by the imaging device 1 are different from each other to one piece of image information.

(H) OCR (Optical Character Recognition) Function

When this function is implemented, for instance, the function enhancement device 3 is able to specify or extract a character string included in image information (such as a face image of a person) obtained by imaging by the imaging device 1. Thus, the function enhancement device 3 is able to manage personal information or the like of the person in association with a face image.

(I) Geometric Pattern Recognition Function

When this function is implemented, for instance, the function enhancement device 3 is able to specify or extract a geometric pattern included in image information (such as a face image of a person) obtained by imaging by the imaging device 1. Thus, as well as the OCR function described in (H), the function enhancement device 3 is able to manage personal information or the like of the person in association with a face image.

(J) Color Matching Function

When this function is implemented, first of all, the imaging device 1 captures a subject image (original). Next, the function enhancement device 3 is able to apply a color conversion process to the captured image in order to faithfully reproduce the color of the captured subject image (original) with use of a device such as a printer.

(K) Code Reader Function

When this function is implemented, the function enhancement device 3 is able to apply an image recognition process to a barcode or a two-dimensional code (e.g. a QR code) as an object for image recognition, and to extract predetermined information associated with the barcode or the two-dimensional code.

(L) Anti-shake Function

When this function is implemented, in a case where shake occurs in the imaging device 1, the shake is detected, and an anti-shake optical system is driven in such a manner that fluctuation of a subject image to be formed on an imaging surface of an imaging element accompanied by the shake of the imaging device 1 is cancelled. Thus, an anti-shake function is implemented.

(M) Automatic Tracking Function

When this function is implemented, the function enhancement device 3 is able to analyze frame images to be sequentially obtained by photographing a moving image by the imaging device 1 on a real-time basis, monitor motion (a change in the position) of a specific subject, and track the specific subject.

(N) 3D Camera Function

When this function is implemented, for instance, the function enhancement device 3 is able to form a 3D image by a light-section method of irradiating a measurement object with light from a linear laser light source, receiving reflection light from the measurement object, and measuring a three-dimensional configuration of the measurement object. Further, the function enhancement device 3 is able to form a stereoscopic 3D image by extracting image information from two imaging devices 1. Furthermore, the function enhancement device 3 is also able to perform a process with use of an TOF (Time-of-Flight) analyzer, which is configured to measure a mass of a target by measuring a flight time of accelerated charged particles (ions or electrons).

(O) Area Calculation Function

When this function is implemented, for instance, the function enhancement device 3 is able to perform body length calculation in an ecosystem by an image recognition technique.

(P) GPS (Global Positioning System) Function

When this function is implemented, for instance, the function enhancement device 3 is able to acquire accurate current position information by loading a GPS terminal.

(Q) Stitching Function

When this function is implemented, for instance, it is possible to stitch a plurality of images imaged by a plurality of imaging devices 1 into one image.

(R) VRS (Vehicle Recognition System) Function

When this function is implemented, the function enhancement device 3 is able to recognize a vehicle in an ITS. As a specific example, the function enhancement device 3 is able to recognize a vehicle by a number plate recognition function of collating a number plate of a vehicle imaged by the imaging device 1 with a number plate registered in advance.

REFERENCE SIGNS LIST

1: Imaging device
2: Interface device
3: Function enhancement device
4, 5, 18: Connector
4-A, 5-B: Connector plug
4-B, 5-A: Connector receptacle
10: Function enhancement system
11, 16: Main body
12: Lens barrel
13, 20: Housing
14: Front plate
15: Rear plate
17, 25: Printed substrate
19: Pin
21: Upper wall plate
22: Lower wall plate
23: Left wall plate
24: Right wall plate
26: Hook
27: Guide pin
30: Hook receiving portion
31: Guide groove
1201, 1211: FPGA 1202, 1212, 1216: Interface (I/F)
1213: CDM conversion unit
1214: Frame buffer
1215: Data conversion unit
1217: Physical layer (PHY)
1220: PC

The invention claimed is:

1. A function enhancement device comprising a structure in which the function enhancement device is detachably interposed between an imaging device configured to image a subject and acquire image data, and an interface device configured to perform data communication with an external device so as to enhance a function of the imaging device,
wherein the function of the imaging device to be enhanced is selected from at least one of an operation environment retaining function of retaining an operation environment of the imaging device, a transmission method changing function of changing a transmission method of the image data, and a subject recognition function of recognizing the subject from the image data,
wherein the operation environment retaining function includes a cooling function by a fan, a heating function by a heater, and a dehumidifying function by a dehumidifier element,
the transmission method changing function includes a frame buffer function, and a streaming function, and
the subject recognition function includes an intelligent transport system (ITS), a surveillance (human tracking), an automatic recognition function of number plate, and a function of transmitting moving image and still image.

2. An attaching/detaching structure for a function enhancement device comprising:
at least one of an imaging device configured to image a subject and acquire image data, and an interface device configured to perform data communication with an external device;
the function enhancement device interposed between the imaging device and the interface device so as to enhance a function of the imaging device; and
at least one of a first connector plug and a second connector plug, and at least one of a first connector receptacle and a second connector receptacle,
wherein when the first connector plug is provided in one of the imaging device and the function enhancement device, the first connector receptacle with respect to which the first connector plug is insertable and withdrawable is provided in the other of the imaging device the function enhancement device,
when the second connector plug is provided in one of the interface device and the function enhancement device, the second connector receptacle with respect to which the second connector plug is insertable and withdrawable is provided in the other of the interface device and the function enhancement device,
the function enhancement device is detachably attachable to at least one of the imaging device and the interface device by insertion or withdrawal of the at least one of the first connector plug and the second connector plug with respect to the at least one of the first connector receptacle and the second connector receptacle,
wherein the function of the imaging device to be enhanced is selected from at least one of an operation environment retaining function of retaining an operation environment of the imaging device, a transmission method changing function of changing a transmission method of the image data, and a subject recognition function of recognizing the subject from the image data,
wherein the operation environment retaining function includes a cooling function by a fan, a heating function by a heater, and a dehumidifying function by a dehumidifier element,
the transmission method changing function includes a frame buffer function, and a streaming function, and
the subject recognition function includes an intelligent transport system (ITS), a surveillance (human tracking), an automatic recognition function of number plate, and a function of transmitting moving image and still image.

3. The attaching/detaching structure for the function enhancement device according to claim 2, wherein
at least one of the imaging device and the interface device, and the function enhancement device are configured such that
at least one of a first hook and a second hook, and at least one of a first hook receiving portion and a second receiving portion are provided,
when the first hook is provided in one of the imaging device and the function enhancement device, the first hook receiving portion engageable with the first hook is provided in the other of the imaging device and the function enhancement device,
when the second hook is provided in one of the interface device and the function enhancement device, the second hook receiving portion engageable with the second hook is provided in the other of the interface device and the function enhancement device, and
the function enhancement device is fixedly mounted to at least one of the imaging device and the interface device by engagement between the hook and the hook receiving portion in a state that the connector plug is inserted in the connector receptacle.

4. The attaching/detaching structure for a function enhancement device according to claim 2, wherein
at least one of the imaging device and the interface device, and the function enhancement device are configured such that
at least one of a first guide pin and a second guide pin, and at least one of a first guide groove and a second guide groove are provided,
when the first guide pin extending in a direction in which the first connector plug is inserted or withdrawn is provided in one of the imaging device and the function enhancement device, the first guide groove engageable with the first guide pin is provided in the other of the imaging device and the function enhancement device,
when the second guide pin extending in a direction in which the second connector plug is inserted or withdrawn is provided in one of the interface device and the function enhancement device, the second guide groove engageable with the second guide pin is provided in the other of the interface device and the function enhancement device, and
the function enhancement device is guided to at least one of the imaging device and the interface device by engagement between the guide pin and the guide groove in inserting the connector plug in the connector receptacle.

5. An attaching/detaching structure for a function enhancement device comprising:
a plurality of function enhancement devices, each of which is interposed between an imaging device configured to image a subject and acquire image data, and an interface device configured to perform data communication with an external device so as to enhance a function of the imaging device, wherein one of the plurality of function enhancement devices includes a connector plug or a connector receptacle capable of implementing insertion or withdrawal with respect to the other one of the function enhancement devices, wherein the function of the imaging device to be enhanced is selected from at least one of an operation environment retaining function of retaining an operation environment of the imaging device, a transmission method changing function of changing a transmission method of the image data, and a subject recognition function of recognizing the subject from the image data, wherein the operation environment retaining function includes a cooling function by a fan, a heating function by a heater, and a dehumidifying function by a dehumidifier element, the transmission method changing function includes a frame buffer function, and a streaming function, and the subject recognition function includes an intelligent transport system (ITS), a surveillance (human tracking), an automatic recognition function of number plate, and a function of transmitting moving image and still image.

6. The attaching/detaching structure for the function enhancement device according to claim 5, wherein one and the other one of the plurality of function enhancement devices respectively include a hook and a hook receiving portion mutually engageable in a state that the connector plug and the connector receptacle are engaged.

7. The attaching/detaching structure for the function enhancement device according to claim 5, wherein one and the other one of the plurality of function enhancement devices respectively include a guide pin and a guide groove mutually engageable in a state that the connector plug and the connector receptacle are engaged.

8. A function enhancement system comprising:

an imaging device configured to image a subject and acquire image data;

an interface device configured to perform data communication with an external device; and a function enhancement device detachably interposed between the imaging device and the interface device so as to enhance a function of the imaging device, wherein the function of the imaging device to be enhanced is selected from at least one of an operation environment retaining function of retaining an operation environment of the imaging device, a transmission method changing function of changing a transmission method of the image data, and a subject recognition function of recognizing the subject from the image data, wherein the operation environment retaining function includes a cooling function by a fan, a heating function by a heater, and a dehumidifying function by a dehumidifier element, the transmission method changing function includes a frame buffer function, and a streaming function, and the subject recognition function includes an intelligent transport system (ITS), a surveillance (human tracking), an automatic recognition function of number plate, and a function of transmitting moving image and still image.

9. The function enhancement device according to claim 1, wherein the function of the imaging device to be enhanced includes an image processing function of processing image data, and the image processing function includes an image correcting function, a resolution changing function, a digital zoom function, an image compressing function, a gradation correcting function, a low-pass filter function, and a spectral processing function.

10. The attaching/detaching structure for a function enhancement device according to claim 2, wherein the function of the imaging device to be enhanced includes an image processing function of processing image data, and the image processing function includes an image correcting function, a resolution changing function, a digital zoom function, an image compressing function, a gradation correcting function, a low-pass filter function, and a spectral processing function.

11. The attaching/detaching structure for a function enhancement device according to claim 5, wherein the function of the imaging device to be enhanced includes an image processing function of processing image data, and the image processing function includes an image correcting function, a resolution changing function, a digital zoom function, an image compressing function, a gradation correcting function, a low-pass filter function, and a spectral processing function.

12. The function enhancement system according to claim 8, wherein the function of the imaging device to be enhanced includes an image processing function of processing image data, and the image processing function includes an image correcting function, a resolution changing function, a digital zoom function, an image compressing function, a gradation correcting function, a low-pass filter function, and a spectral processing function.

13. The function enhancement device according to claim 1, further comprising: a processor performing an enhancement of the function of the imaging device.

14. The attaching/detaching structure for a function enhancement device according to claim 2, wherein the function enhancement device includes a processor performing an enhancement of the function of the imaging device.

15. The attaching/detaching structure for a function enhancement device according to claim 5, wherein the function enhancement device includes a processor performing an enhancement of the function of the imaging device.

16. The function enhancement system according to claim 8, wherein the function enhancement device includes a processor performing an enhancement of the function of the imaging device.

* * * * *